(12) United States Patent
Xu et al.

(10) Patent No.: US 11,348,867 B2
(45) Date of Patent: May 31, 2022

(54) CAPACITOR STRUCTURE FOR INTEGRATED CIRCUIT AND RELATED METHODS

(71) Applicant: GLOBALFOUNDRIES U.S. INC., Santa Clara, CA (US)

(72) Inventors: Dewei Xu, Clifton Park, NY (US); Sunil K. Singh, Mechanicville, NY (US); Seung-Yeop Kook, Mechanicville, NY (US); Roderick A. Augur, Saratoga Springs, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/089,775

(22) Filed: Nov. 5, 2020

(65) Prior Publication Data

US 2022/0139819 A1    May 5, 2022

(51) Int. Cl.
*H01L 23/522* (2006.01)
*H01L 49/02* (2006.01)

(52) U.S. Cl.
CPC .......... *H01L 23/5223* (2013.01); *H01L 28/55* (2013.01); *H01L 28/92* (2013.01)

(58) Field of Classification Search
CPC .................................................. H01L 23/5223
See application file for complete search history.

(56) References Cited

U.S. PATENT DOCUMENTS

| | | | |
|---|---|---|---|
| 5,999,010 A | 12/1999 | Arora et al. | |
| 6,061,508 A | 5/2000 | Mehrotra et al. | |
| 6,885,056 B1 | 4/2005 | Dornisch et al. | |
| 7,089,516 B2 | 8/2006 | Arora et al. | |
| 7,538,006 B1 | 5/2009 | Anderson et al. | |
| 7,900,164 B1 | 3/2011 | Chen et al. | |
| 9,698,213 B1 | 7/2017 | Yang | |
| 9,985,089 B2 | 5/2018 | Yang | |
| 2006/0071262 A1* | 4/2006 | Wang | H01L 28/55 257/E21.582 |
| 2007/0173012 A1* | 7/2007 | Aoki | H01L 21/76838 257/E21.582 |
| 2011/0018099 A1 | 1/2011 | Muramatsu | |

(Continued)

OTHER PUBLICATIONS

U.S. Appl. No. 16/408,536, Office Action dated Oct. 14, 2020, 21 pages.

(Continued)

*Primary Examiner* — Omar F Mojaddedi

(74) *Attorney, Agent, or Firm* — Anthony Canale; Hoffman Warnick LLC

(57) ABSTRACT

Embodiments of the disclosure provide a capacitor for an integrated circuit (IC). The capacitor may include a first vertical electrode on an upper surface of a first conductor within a first wiring layer. A capacitor dielectric may be on an upper surface of the first vertical electrode. A second vertical electrode may be on an upper surface of the capacitor dielectric. The second vertical electrode is vertically between the capacitor dielectric and a second conductor. An inter-level dielectric (ILD) layer is adjacent to each of the first vertical electrode, the capacitor dielectric, and the second vertical electrode. The ILD layer is vertically between the first conductor and the second conductor.

16 Claims, 9 Drawing Sheets

(56) References Cited

U.S. PATENT DOCUMENTS

| | | | |
|---|---|---|---|
| 2012/0091519 A1* | 4/2012 | Tu ..................... | H01L 23/5223 257/303 |
| 2012/0119326 A1 | 5/2012 | Sugisaki et al. | |
| 2013/0307158 A1 | 11/2013 | Anderson et al. | |
| 2018/0158617 A1 | 6/2018 | Carver et al. | |

OTHER PUBLICATIONS

U.S. Appl. No. 16/408,536, Notice of Allowance dated Jan. 13, 2021, 9 pages.

* cited by examiner though, it will be apparent to one skilled in the art that the present teachings may be practiced without these specific details. In other instances, well-known methods, procedures, components, and circuitry have not been described in detail so as not to unnecessarily obscure aspects of the present teachings.

CAPACITOR STRUCTURE FOR INTEGRATED CIRCUIT AND RELATED METHODS

BACKGROUND

The present disclosure relates to integrated circuit (IC) structure formation, and more specifically, to a capacitor structure for an IC, and related methods to form the capacitor structure.

Capacitor structures in an IC conventionally include two metal plates with an insulator between the plates. In such a configuration, the plates occupy at least a minimum surface area to achieve desired capacitances. One conventional approach for integrating capacitors into an integrated circuit is to form transverse metal lines, or "fingers," extending outward from a larger wire interdigitating the transverse metal lines with similar metal lines of a nearby wire. However, such a configuration may impose limits on manufacturability and capacitance ranges as devices continue to decrease in size. Such limits on the size of a capacitor are of particular concern when a product specification requires an ultra-low capacitor, i.e., capacitors with no more than approximately 0.5 femtofarads (fF). Conventional approaches for providing ultra-low capacitance have included, e.g., increasing the space between alternating horizontal electrodes to reduce the capacitance density in the capacitor structure. Alternate approaches have included serially connecting larger capacitors together to reduce the effective capacitance between two nodes. These and other approaches, however, have produced significant uncertainty and error in the actual capacitance of a device.

SUMMARY

Aspects of the disclosure provide a capacitor for an integrated circuit (IC), the capacitor including: a first vertical electrode on an upper surface of a first conductor within a first wiring layer; a capacitor dielectric on an upper surface of the first vertical electrode; a second vertical electrode on an upper surface of the capacitor dielectric, wherein the second vertical electrode is vertically between the capacitor dielectric and a second conductor; and an inter-level dielectric (ILD) layer adjacent to each of the first vertical electrode, the capacitor dielectric, and the second vertical electrode, wherein the ILD layer is vertically between the first conductor and the second conductor.

Further aspects of the disclosure provide a wiring layer stack for an integrated circuit (IC), the wiring layer stack including: a first wiring layer including a first plurality of conductors; an inter-level dielectric (ILD) layer on an upper surface of the first wiring layer; a second wiring layer on an upper surface of the ILD layer, the second wiring layer including a second plurality of conductors; at least one capacitor within the ILD layer, the at least one capacitor including: a first vertical electrode on an upper surface of one of the first plurality of conductors, a capacitor dielectric on an upper surface of the first vertical electrode, and a second vertical electrode on an upper surface of the capacitor dielectric, wherein the second vertical electrode is vertically between the capacitor dielectric and one of the second plurality of conductors; and at least one via within the ILD layer coupling one of the first plurality of conductors to one of the second plurality of conductors, wherein a portion of the ILD layer horizontally separates the via from the at least one capacitor.

Additional aspects of the disclosure provide a method to form a capacitor for an integrated circuit (IC), the method including: forming a first opening within a first portion of an inter-level dielectric (ILD) layer to expose a first conductor below the first portion of the ILD layer; forming a first vertical electrode on an upper surface of the first conductor and within the first portion of the ILD layer to fill the first opening; forming a capacitor dielectric on an upper surface of the first vertical electrode; forming a second vertical electrode on an upper surface of the capacitor dielectric; and forming a second portion of the ILD layer on an upper surface of the first portion of the ILD layer, adjacent the capacitor dielectric and the second vertical electrode.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
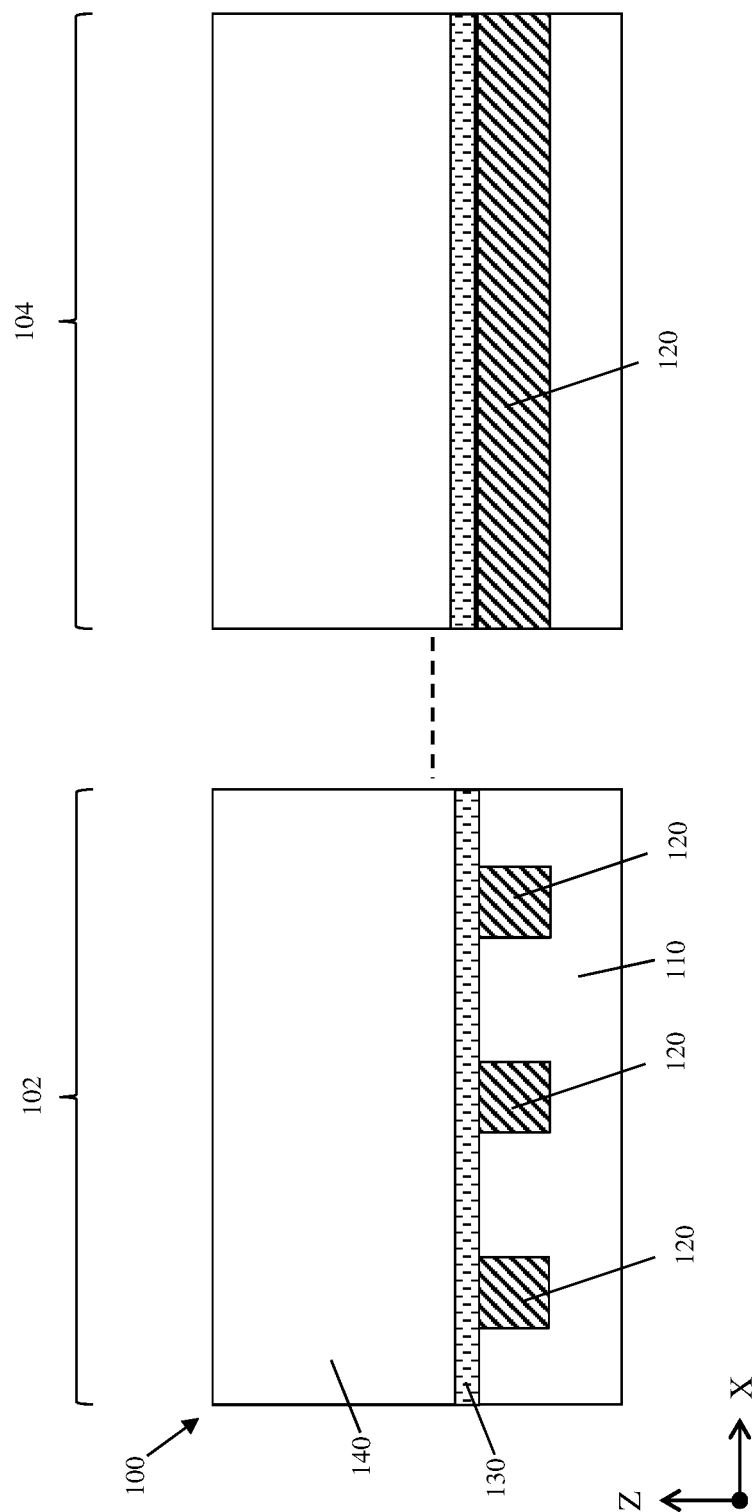
FIG. 1 shows a cross-sectional view of a preliminary structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a capacitor structure for an IC, and related methods to form the capacitor structure. Embodiments of the capacitor structure may include, e.g., a first vertical electrode on an upper surface of a first conductor within a first wiring layer. A capacitor dielectric may be on an upper surface of the first vertical electrode. A second vertical electrode may be on an upper surface of the capacitor dielectric, thereby positioning the second vertical electrode vertically between the capacitor dielectric and a second conductor. An inter-level dielectric (ILD) layer may be adjacent to the first vertical electrode, the capacitor dielectric, and the second vertical electrode. The ILD layer may also be vertically between the first conductor and the second conductor. Methods according to embodiments of the disclosure are operable to form the capacitor structure, and optionally may form other portions of an IC such as wiring levels above and below the capacitor structure.

FIG. 1 shows a cross-sectional view in plane X-Z of a preliminary structure 100 to be processed according to embodiments of the disclosure. Preliminary structure 100 as shown in FIG. 1 provides one initial set of materials targeted for use with embodiments of the disclosure, but it is understood that embodiments of the disclosure may be implemented on different designs without significant changes to the various example techniques discussed herein.

Preliminary structure 100 may include a first region 102 and a second region 104 in two different locations within plane X-Z. As an example, first region 102 is shown to be horizontally separated from second region 104 by an indeterminate distance indicated with a dashed line. In various other implementations, each region 102, 104 may be directly adjacent to each other, separated along different directions (e.g., within plane Y-Z), and/or in any other spatial arrangement. Various portions of preliminary structure 100 may be formed on a first wiring level 110 including various insulative and/or conductive materials. First wiring level 110 may be positioned on (i.e., directly or indirectly) or otherwise above a device layer including electrical devices such as transistors, diodes, resistors, capacitors, inductors, etc., for providing operational features of a device. The composition and function of a device layer is generally known in the art, and not shown in the accompanying FIGS., or discussed in further detail herein.

Wiring level 110 may be formed of insulative materials, e.g., one or more oxide-based dielectric materials suitable to physically and electrically separate respective regions of conductive material in wiring level 110. Oxide-based dielectric materials may also be appropriate for distinguishing from other dielectric materials, as discussed elsewhere herein. Dielectric materials may include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Portions of wiring level 110 may include a first conductor 120 (e.g., one or more metal wires) for electrically coupling portions of a device layer to other wiring levels and/or other portions of a device layer. First conductor 120 may include any currently known or later developed conductive substance capable of forming a conductive pathway between multiple electrically active elements. As examples, first conductor 120 may include any and/or all conductive materials such as copper (Cu), aluminum (Al), tungsten (W), cobalt (Co), titanium (Ti), etc. Though not shown in the accompanying FIGS., a barrier liner may also be deposited on the sidewalls of insulative material adjacent first conductor 120, and may precede first conductor 120 formation. The deposited barrier liner may include any now known or later developed barrier liner material (e.g., refractory metal liner) including but not limited to: tantalum nitride (TaN) and tantalum; tantalum nitride, tantalum and cobalt; and magnesium (Mn), or combinations thereof. First conductor 120 may be formed, e.g., by deposition of conductive materials within trenches of wiring level 110, and/or by patterning of wiring level 110 and/or first conductor 120 material. Three first conductors 120 are shown in first region 102 of insulative structure and one first conductor 120 is shown in second region 104 of preliminary structure 100 as an example, though this is not necessarily the case in all implementations. Forming a material by "depositing" or "deposition" generally may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Preliminary structure 100 may include, e.g., a barrier film 130 above wiring level 110 and first conductor 120 therein to vertically isolate overlying materials from wiring level 110 thereunder. Barrier film 130 may include one or more electrically insulative materials with a particularly high resistance to etching. Barrier film 130 more specifically may be formed as an "etch stop layer," configured to prevent underlying device components from being removed or modified in subsequent processing. Barrier film 130 thus may include, e.g., an oxygen-doped silicon carbide (SiC:O) layer, a nitrogen-doped silicon carbide (SiC:N) layer, or other material with similar properties. Preliminary structure 100 may also include a first portion of an ILD layer 140 (simply "first portion" hereafter) on barrier film 130. First portion 140 may include one or more insulative materials included within wiring level 110, and/or may include any other currently known or later developed insulative material.

Figure 2:
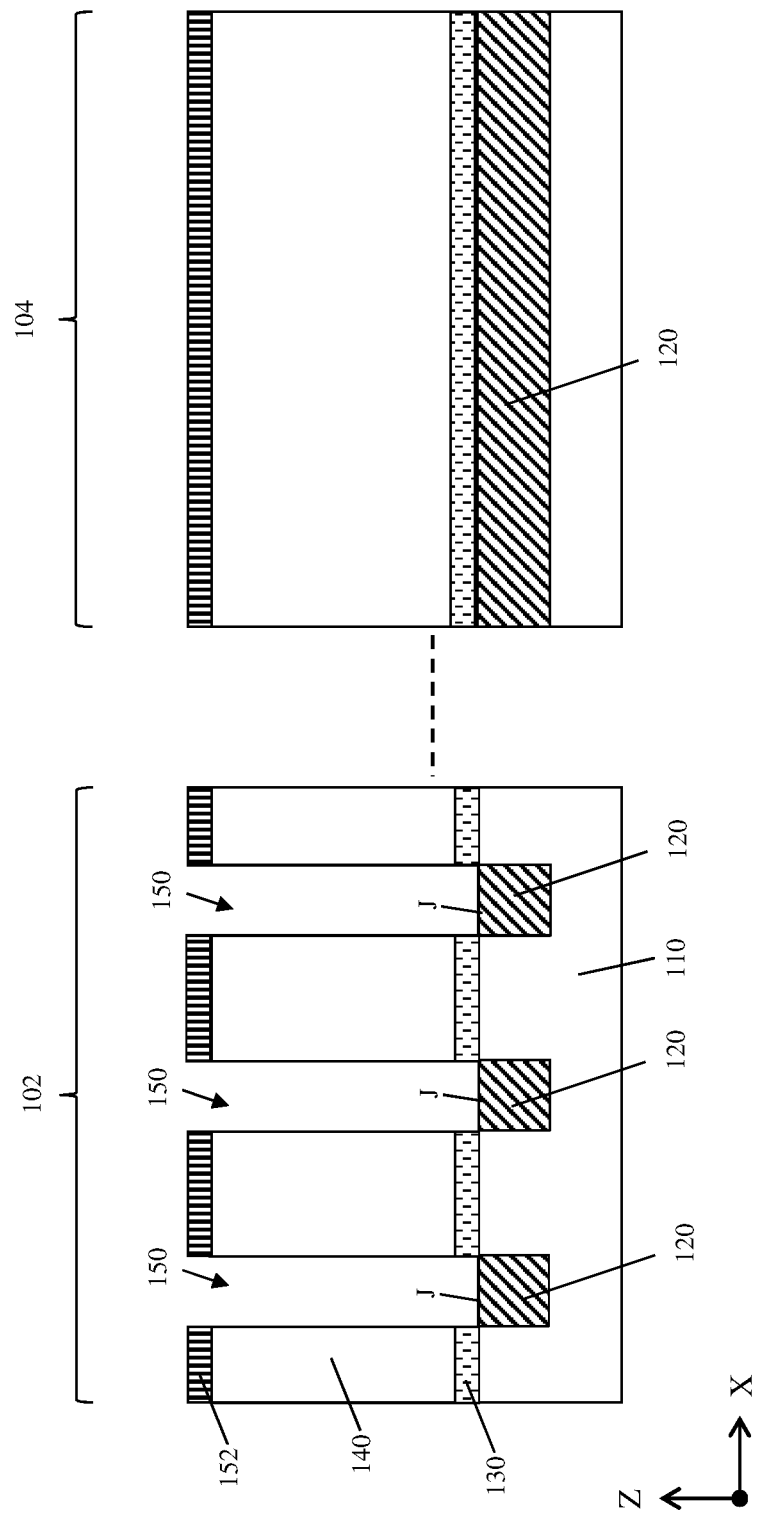
FIG. 2 shows a cross-sectional view of forming a first opening within a first portion of an inter-level dielectric (ILD) layer according to embodiments of the disclosure.

Turning to FIG. 2, embodiments of the disclosure may include forming one or more first openings 150 within first portion 140 and within first region 102, without forming first opening(s) 150 within second region 104. Reactive ion etching (RIE) with a mask 152 in place on first portion 140 is one technique suitable to form first opening(s) 150. Etching generally refers to the removal of material from a substrate (or structures formed on the substrate), and is often performed with mask 152 in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features suitable to create similar elements, e.g., vertical electrodes as discussed herein. The forming of first opening(s) 150 may also remove underlying portions of barrier film 130 to expose upper surfaces J of first conductor(s) 120.

Figure 3:
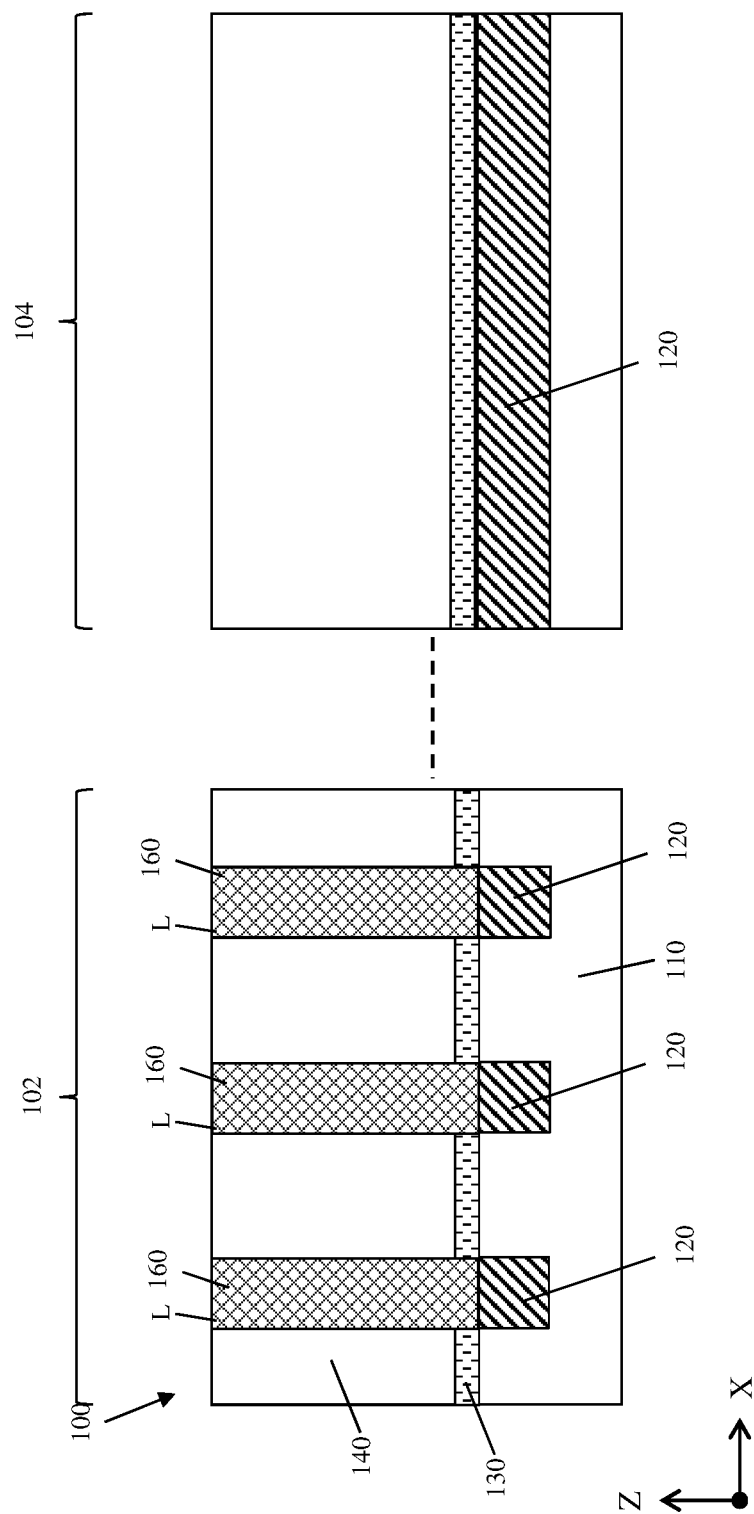
FIG. 3 shows a cross-sectional view of forming a first vertical electrode in the first opening according to embodiments of the disclosure.

Referring to FIG. 3, embodiments of the disclosure include forming a first vertical electrode on upper surface J (FIG. 2) of first conductor(s) 120. First vertical electrode 160 may include any currently known or later developed material suitable for use as a capacitor electrode, e.g., aluminum (Al), tantalum (Ta), silver (Ag), one or more metals described herein with respect to first conductor(s) 120, and/or other conductive materials. First vertical electrode 160 may be formed by deposition to partially or completely fill first opening(s) 150 (FIG. 2). Where multiple first opening(s) 150 have been formed, first vertical electrode(s) 160 may be formed by deposition and subsequent etching, planarization, etc., causing the upper surface of first portion 140 to be coplanar with upper surface(s) L of first vertical electrode(s) 160. Mask 152 (FIG. 2) also may be removed by any suitable process (e.g., stripping) after before, during, or after the forming of first vertical electrode(s) 160.

Figure 4:
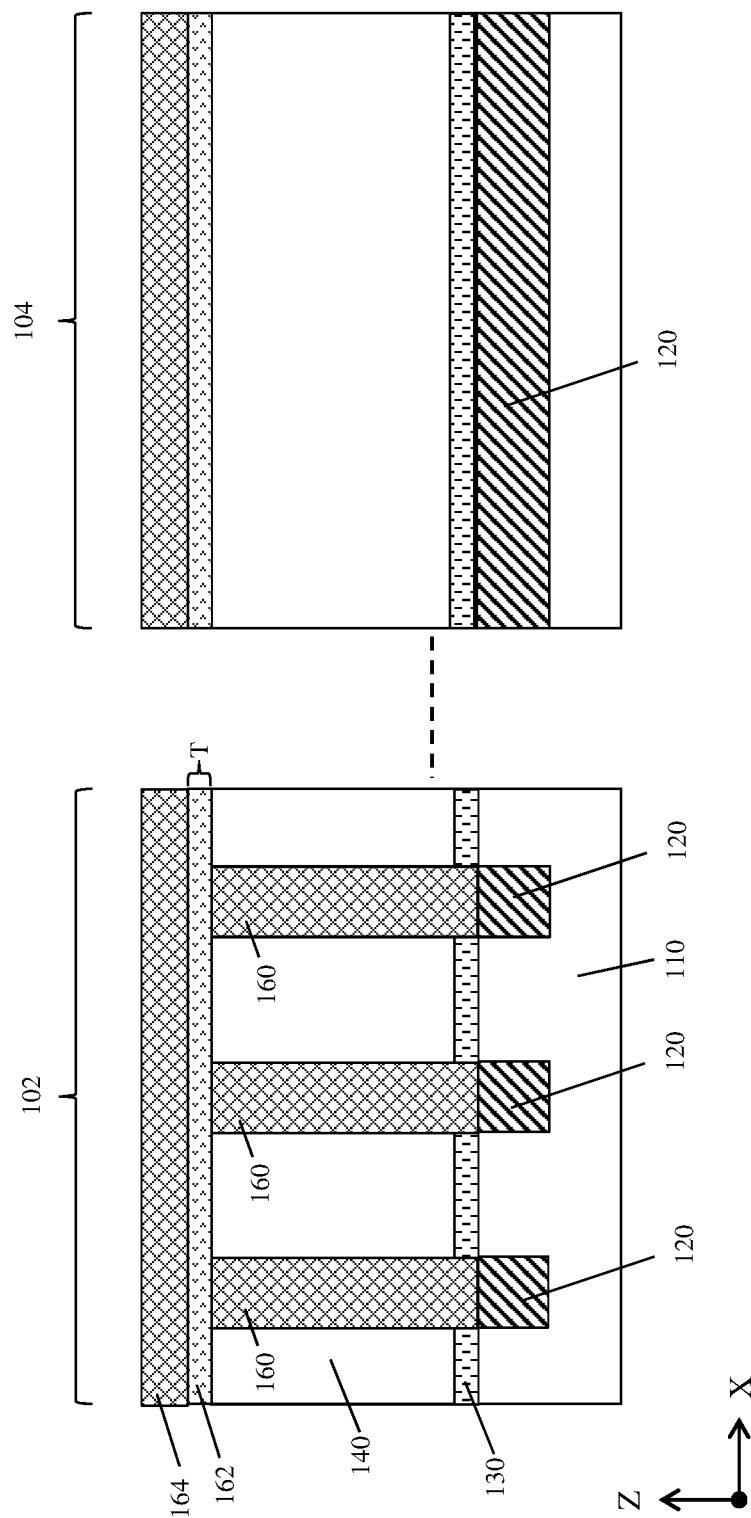
FIG. 4 shows a cross-sectional view of forming a capacitor dielectric material and electrode material according to embodiments of the disclosure.

Continuing to FIG. 4, embodiments of the disclosure may include forming other materials for a capacitor structure, to be located within ILD material of an IC (e.g., above first portion 140). The forming of such materials may include, e.g., forming a capacitor dielectric layer 162 and an electrode layer 164 on upper surface L of first vertical electrode(s) 160, in addition to exposed portions of first portion 140. In the case of deposition, capacitor dielectric layer 162 may be formed on first region 102 and second region 104 non-selectively. In this case, electrode layer 164 may also cover an entirety of capacitor dielectric layer 162 in first region 102 and second region 104. Capacitor dielectric layer 162 may have a different material composition from first portion 140, and may be chosen to have a higher dielectric constant than the insulating material of first portion 140. According to one example, capacitor dielectric layer 162 may include one or more oxide-based dielectric materials (e.g., $HfO_2$), and/or nitride-based dielectric materials, e.g., silicon nitride (SiN), while first portion 140 may include one or more oxide dielectric materials, e.g., silicon dioxide ($SiO_2$). In further embodiments, capacitor dielectric layer 162 may include any dielectric material having a higher dielectric constant than that of first portion 140. According to an example implementation, capacitor dielectric layer 162 may be formed to a vertical thickness T of between approximately five nanometers (nm) and approximately fifteen above first vertical electrode(s) 160. Electrode layer 164 may have the same composition, or a similar composition to first vertical electrode 160, and may be formed on capacitor dielectric layer 162 to any desired vertical thickness.

Figure 5:
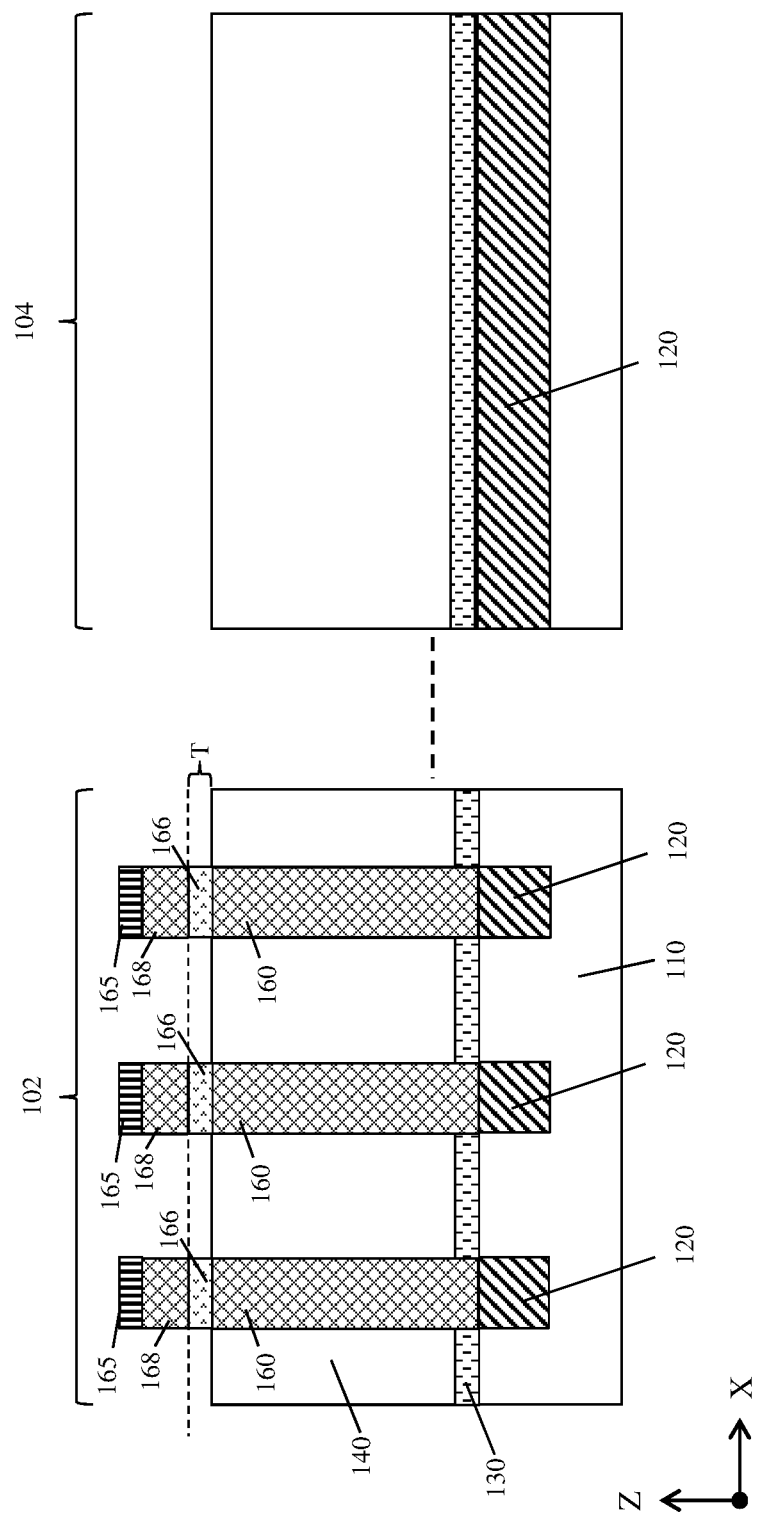
FIG. 5 shows a cross-sectional view of forming a capacitor dielectric and second vertical electrode according to embodiments of the disclosure.

Continuing to FIG. 5, continued processing may include using capacitor dielectric layer 162 (FIG. 4) and electrode layer 164 (FIG. 4) to form the remaining components of a capacitor at desired locations in first region 102. For instance, mask(s) 165 may be formed on portions of electrode layer 164 (FIG. 4) that are vertically above first vertical electrode(s) 160. With mask(s) 165 in place, exposed portions of dielectric layer and electrode layer 164 in first region 102 and second region 104 can be removed (e.g., via etching). Remaining portions of the materials may form a set of capacitor dielectrics 166, each located on upper surface L (FIG. 3) of first vertical electrode 160 thereunder. Similarly, remaining portions of electrode layer 164 may define a set of second vertical electrodes 168, each being on the upper surface of capacitor dielectric 166 thereunder. The height of second vertical electrode(s) 168 above capacitor dielectric 166 may be different from the height of first vertical electrode 160 above first conductor 120. In some cases, first vertical electrode 160 may be substantially taller along the Z axis than second vertical electrode 166, but this is not necessarily the case in all implementations.

The forming of capacitor dielectric 166, e.g., by depositing capacitor dielectric layer 162 before etching the deposited material(s) from non-capacitor areas of a device, may allow greater control over the size of capacitor dielectric 166. However, this approach is not necessarily required in all implementations. Capacitor dielectric 166 and second vertical electrode 168 may be formed by any process to selectively form such materials on first vertical electrode 160, e.g., forming a material, forming openings over first vertical electrode(s) 160, and forming capacitor dielectric 166 and second vertical electrode 168 in the opening(s). In this case, the size of capacitor dielectric 166 could be controlled by etching, rather than by deposition. Further variations may allow the size of capacitor dielectric 166 to be determined by other processes. Regardless of the process(es) used to form capacitor dielectric and/or vertical electrode 168, capacitor dielectric 166 may retain thickness T of between approximately five and approximately fifteen nm, as discussed elsewhere herein. Mask(s) 165 may be removed where applicable, e.g., by stripping and/or any other process suitable to remove masking materials from a structure.

Figure 6:
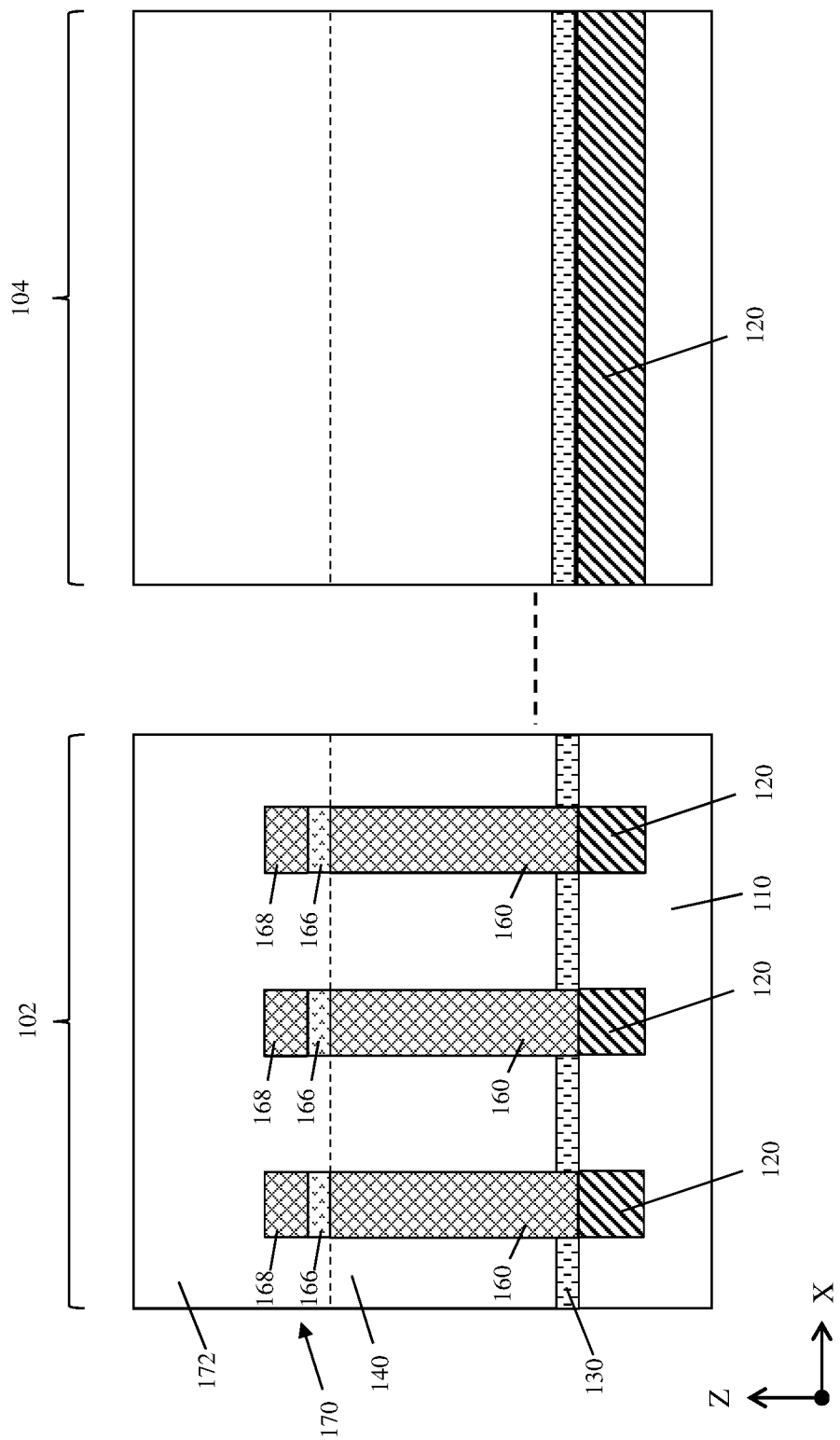
FIG. 6 shows a cross-sectional view of forming a second portion of an ILD layer according to embodiments of the disclosure.

Turning to FIG. 6, embodiments of the disclosure may include forming remaining portions of ILD material for wiring levels of an IC, without significant differences from conventional processing. For example, FIG. 6 illustrates forming an ILD layer 170 by forming a second portion of ILD material (simply "second portion" hereafter) 172 on first portion 140, in capacitor region 104 and second region 104. Second portion 172 also may be formed on, and adjacent to, capacitor dielectric 166 and second vertical electrode 168 in first region 102. Second portion 172 may include the same material, or a similar material, as first portion 140. In cases where second portion 172 has the same composition as first portion 140, there may be no visible interface between first portion 140 and second portion 172 of ILD layer 170. The vertical interface between portions 140, 172 is shown in dashed lines to indicate that each portion 140, 172 is a portion of one ILD layer 170.

Figure 7:
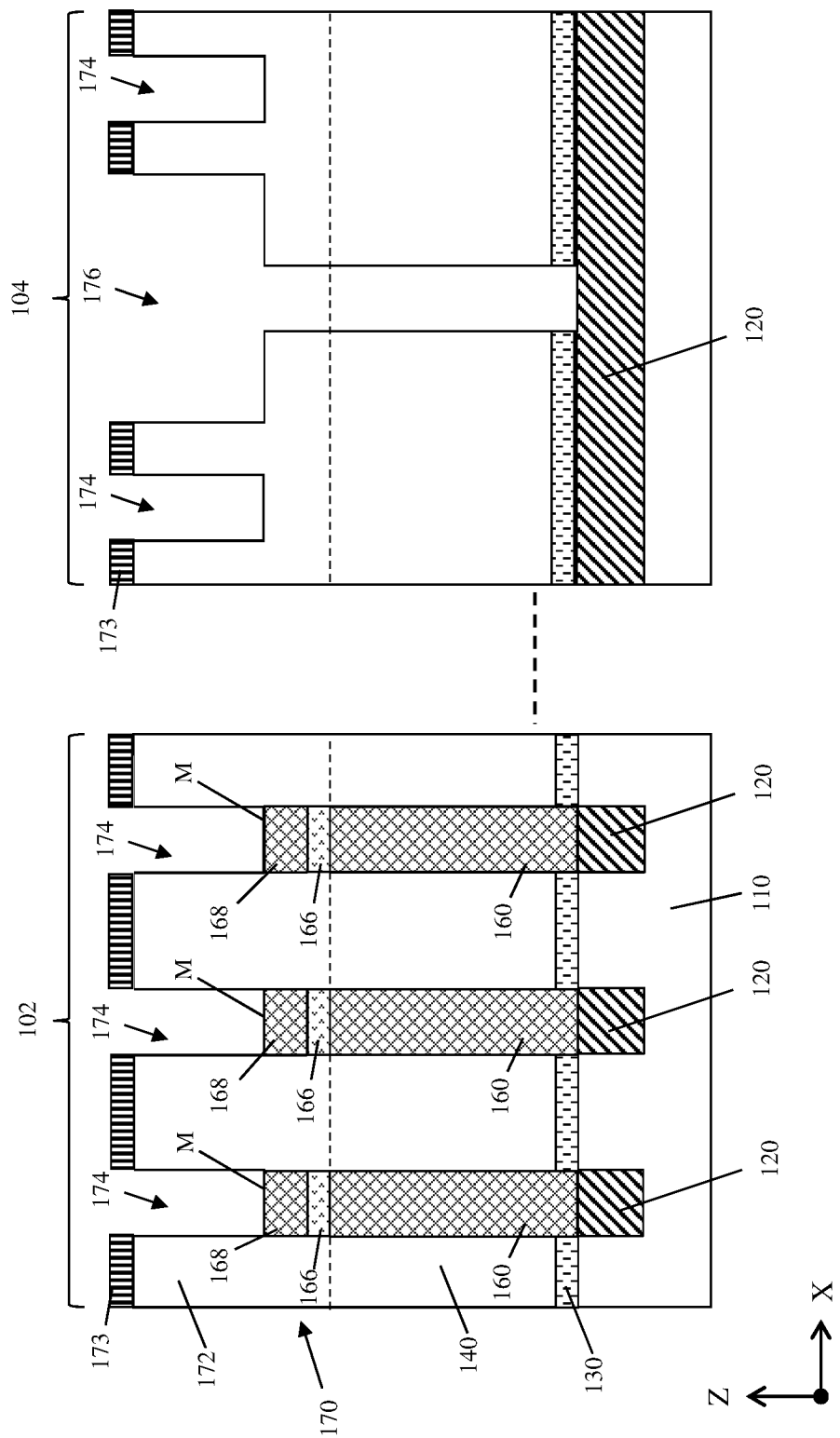
FIG. 7 shows a cross-sectional view of forming a second opening in the second portion of the ILD layer according to embodiments of the disclosure.

Turning to FIG. 7, continued processing may include forming a wiring mask 173 on portions of ILD layer 170, to target portions of first region 102 and second region 104 for subsequent metal deposition. With mask 173 in place on selected portions of ILD layer 170, methods of the disclosure may include forming a set of second openings 174 within second portion 172. Second openings 174 may be formed to expose an upper surface M of second vertical electrode(s) 168 in first region 102. Second opening(s) 174 in wiring region 104 similarly may extend only partially into ILD layer 170. Second opening(s) 174 in second region 104 may be used to form metal wires, some of which may extend transversely (i.e., into or out of the plane of the page) and/or laterally (e.g., horizontally along X or Y axis) at other locations with respect to other conductive elements. In some cases, a third opening 176 may be formed in wiring region 104 by removing portions of ILD layer 170 to expose first conductor 120 thereunder. Third opening 176 may be formed to create a via structure for vertically coupling first conductor 120 to overlying conductive materials as discussed elsewhere herein. Third opening(s) 176 may be deeper than second opening (s) 176, e.g., by being formed with the aid of an additional mask (not shown) before or after second opening(s) 174 have been formed. After second opening(s) 174 and third opening(s) 176 have been formed, mask 173 may be removed by stripping and/or any other process to remove masking materials from a structure.

Figure 8:
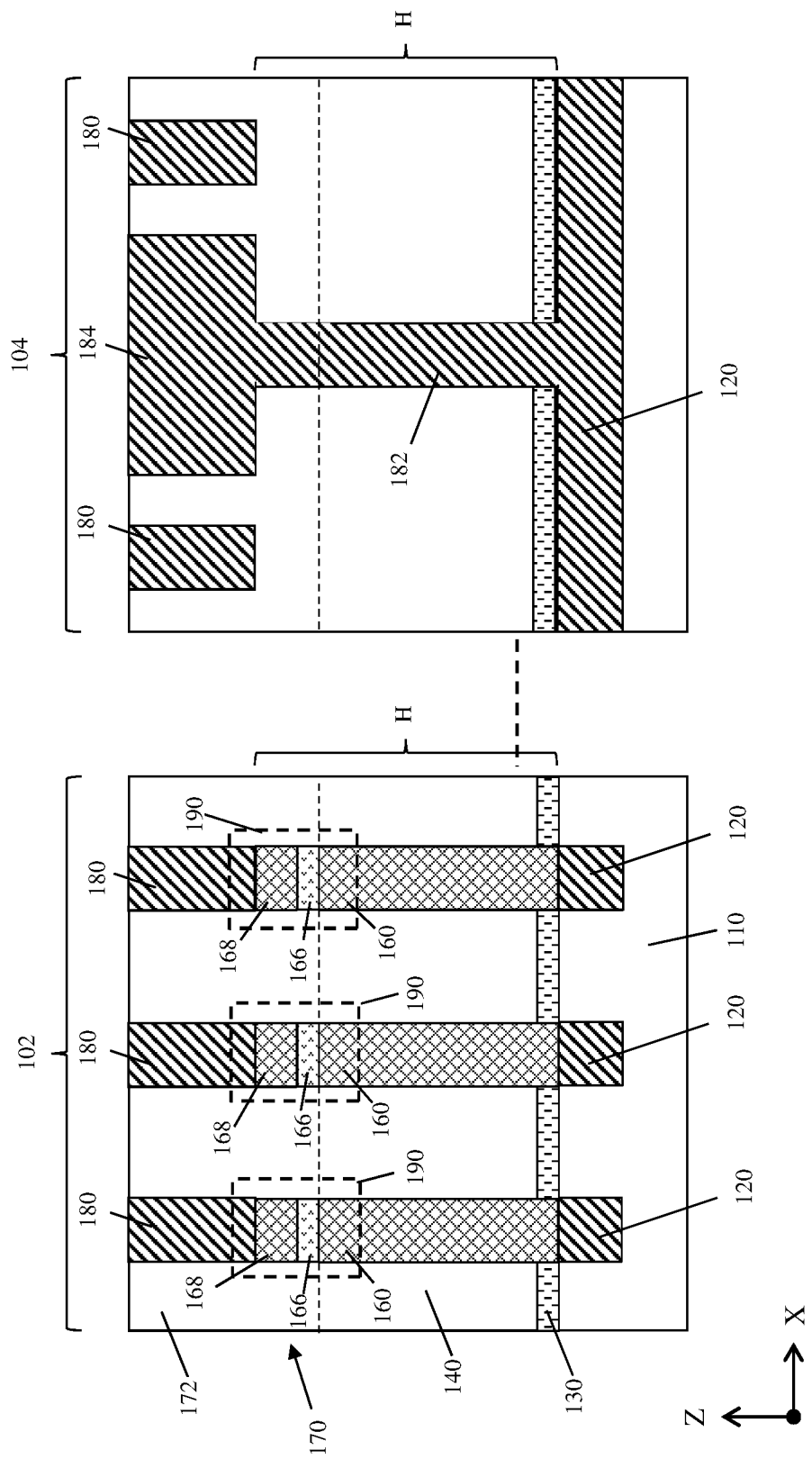
FIG. 8 shows a cross-sectional view of forming a second wiring layer according to embodiments of the disclosure.

Referring to FIG. 8, continued processing may include forming the conductive materials for an overlying wiring layer above wiring layer 110. Forming such materials may include, e.g., depositing a second conductor 180 within second opening(s) 174 (FIG. 7). Second conductor 180 may include any currently-known or later developed conductive material, e.g., any of those discussed herein with respect to first conductor 120. In addition to forming second conductor 180, portions of conductive material may at least partially fill third opening 176 (FIG. 7) in second region 104 to form, e.g., a via 182 on first conductor 120, and a metal wire 184 on via 182. The forming of second conductor 180, via 182, and/or metal wire 184 may be implemented, e.g., by deposition of conductive material, and subsequent planarization. In cases where third opening(s) 176 were formed previously within ILD layer 170, metal wire 184 may have a width that is greater than via 182 due to the shape of third opening(s) 176. Though not shown in the accompanying FIGS., a barrier liner may also be deposited on the sidewalls of opening(s) 174, 176 within ILD layer 170 and may precede second conductor 180, via 182, and/or metal wire 184 formation, e.g., as mentioned elsewhere herein. In some cases, second conductor 180, via 182, and/or metal wire 184 may be formed by a damascene process. Damascene is a process in which an interconnect pattern is first lithographically defined in a layer of dielectric, then metal is deposited to fill resulting wire trench openings or via openings, and then excess metal is removed by means of chemical-mechanical polishing (planarization). Dual damascene is a similar process in which interconnect patterns define wire trench openings and via openings together (e.g., as may be the case in third opening 176) prior to metal deposition. The conductive materials also may be planarized (e.g., by chemical mechanical planarization (CMP) or similar processes) such that they are coplanar with the top surface of ILD layer 170.

Figure 9:
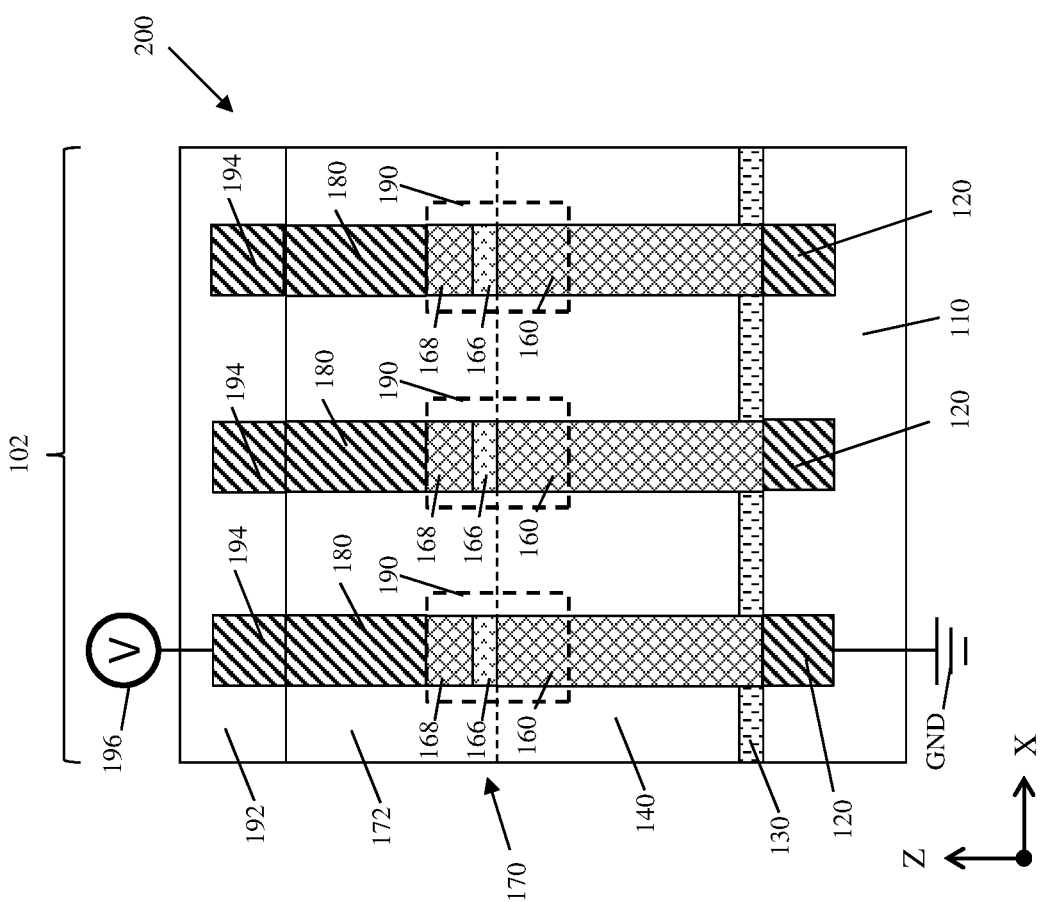
FIG. 9 shows an expanded cross-sectional view of a capacitor and wiring level according to embodiments of the disclosure.

Referring to FIGS. 8 and 9 together, in which FIG. 9 provides an expanded view of elements in first region 102, embodiments of the disclosure provide a capacitor 190 and/or a wiring layer stack 200 for IC structures. After second conductor 180 is formed, first vertical electrode 160, capacitor dielectric 166, and second vertical electrode 168 form an electrical pathway in the form of a capacitor 190. Capacitor 190 vertically couples first conductor 120 to second conductor 180. In such a configuration, capacitor dielectric 166 may be substantially vertically aligned with first vertical electrode 160 and second vertical electrode 168, e.g., as a result of the etching processes and/or other techniques used to form first vertical electrode 160, capacitor dielectric 166, and/or second vertical electrode 168. The term "substantially vertically aligned" may be defined as capacitor dielectric 166 having a vertical centerline axis that is approximately the same as the centerline axes of vertical electrodes 160, 168. Thus, capacitor dielectric 166 may have a different size, width, etc., from vertical electrodes 160, 168 but nonetheless may remain substantially vertically aligned with vertical electrodes 160, 168. ILD layer 170 may horizontally separate capacitor(s) 190 in first region 102 from via 182 (FIG. 8) within second region 104. The horizontal distance between capacitor(s) 190 and via 182 may be, e.g., at least approximately fifty micrometers (μm).

During operation, vertical electrodes 160, 168 may become oppositely-charged when subjected to an electrical potential thereacross, e.g., due to the presence of capacitor dielectric 166. This structure will cause capacitor 190 to store an electrical charge during operation, similar to a conventional parallel plate arrangement. However, capacitor 190 according to the disclosure may provide a low-capacitance capacitor that is embedded within ILD layer 170, and above wiring layer 110. To provide these operational features, an additional wiring layer 192 and metal wire 194 may be formed over ILD layer 170, with metal wire 194 being electrically coupled to second conductor 180. A voltage source 196 (e.g., any conceivable power supply such as a battery) may be coupled to second vertical electrode 168 of capacitor 190 through metal wire(s) 194 and second conductor(s) 180. First vertical electrode 160 similarly may be electrically coupled to ground GND (alternatively, another node having a voltage different from voltage source 196) through first conductor 120. Voltage source 196 and ground GND are illustrated using schematic icons to indicate that they may be coupled to capacitor 190 of wiring layer stack 200 through multiple intervening conductors, layers, electrical structures, etc. Such elements may be coupled through portions of first conductor 120, second conductor 180, metal wire 194, etc., that extend into or out of the plane of the page. In further implementations, wiring layer 110 and/or additional wiring layer 192 may include additional vias for coupling first conductor 120 and/or metal wire 194 to other wiring layers in wiring layer stack 200.

Embodiments of the disclosure provide various technical and commercial advantages, some of which are described herein as examples. Capacitor 190 and wiring layer stack 200 may feature capacitor dielectric 166 with a vertical thickness that is determined by deposition characteristics (e.g., deposition time) instead of by etching characteristics. Deposition is easier to control than etching, and thus the size of capacitor dielectric 166 may have little variance as opposed to capacitors that are formed by conventional techniques. These attributes, in turn, may allow very low capacitances (e.g., approximately 0.5 fF) to be achieved more consistently than other types of capacitors in ICs. The resulting variation in capacitance from design specifications may be, e.g., at most approximately ten percent error from the desired amount of capacitance in capacitor 190. Methods of the disclosure can also be integrated into conventional processes to form metal wiring layers of an IC, without fundamentally changing the operational methodology and/or adding a significant number of additional steps.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A capacitor for an integrated circuit (IC), the capacitor comprising: a first vertical electrode on an upper surface of a first conductor within a first wiring layer, the first vertical electrode having a sidewall; a capacitor dielectric on an upper surface of the first vertical electrode, and including a sidewall vertically aligned with the sidewall of the first vertical electrode; a second vertical electrode on an upper surface of the capacitor dielectric, wherein the second vertical electrode is vertically between the capacitor dielectric and a second conductor, and including a sidewall vertically aligned with the sidewall of the first vertical electrode; and an inter-level dielectric (ILD) layer adjacent to each of the first vertical electrode, the capacitor dielectric, and the second vertical electrode, wherein the ILD layer is vertically between the first conductor and the second conductor, wherein the second conductor includes a metal wire within a second wiring layer of the IC, wherein the second conductor is vertically aligned with the first vertical electrode, the capacitor dielectric, and the second vertical electrode.

2. The capacitor of claim 1, wherein a vertical thickness of the capacitor dielectric between the first vertical electrode and the second vertical electrode is between approximately five nanometers (nm) and approximately fifteen nm.

3. The capacitor of claim 1, wherein the ILD layer includes an oxide dielectric material and wherein the capacitor dielectric includes a nitride dielectric material.

4. The capacitor of claim 1, wherein a portion of the ILD layer horizontally separates the first vertical electrode, the capacitor dielectric, and the second vertical electrode from a via within the ILD layer.

5. The capacitor of claim 4, wherein a combined height of the first vertical electrode, the capacitor dielectric, and the second vertical electrode above the first wiring layer is approximately equal to a height of the via above the first wiring layer.

6. The capacitor of claim 1, further comprising a barrier film adjacent the first vertical electrode, and below the ILD layer.

7. A wiring layer stack for an integrated circuit (IC), the wiring layer stack comprising: a first wiring layer including a first plurality of conductors; an inter-level dielectric (ILD) layer on an upper surface of the first wiring layer; a second wiring layer on an upper surface of the ILD layer, the second wiring layer including a second plurality of conductors; at least one capacitor within the ILD layer, the at least one capacitor including: a first vertical electrode on an upper surface of one of the first plurality of conductors, the first vertical electrode having a sidewall, a capacitor dielectric on an upper surface of the first vertical electrode, and including a sidewall vertically aligned with the sidewall of the first vertical electrode, and a second vertical electrode on an upper surface of the capacitor dielectric, wherein the second vertical electrode is vertically between the capacitor dielectric and one of the second plurality of conductors, and including a sidewall vertically aligned with the sidewall of the first vertical electrode; and at least one via within the ILD layer coupling one of the first plurality of conductors to one of the second plurality of conductors, wherein a portion of the ILD layer horizontally separates the via from the at least one capacitor, wherein the second conductor is vertically aligned with the first vertical electrode, the capacitor dielectric and the second vertical electrode.

8. The wiring layer stack of claim 7, wherein a vertical thickness of the capacitor dielectric between the first vertical electrode and the second vertical electrode is between approximately five nanometers (nm) and approximately fifteen nm.

9. The wiring layer stack of claim 7, wherein the ILD layer includes an oxide dielectric material and wherein the capacitor dielectric includes a nitride dielectric material.

10. The wiring layer stack of claim 7, wherein a height of the at least one capacitor is approximately equal to a height of the at least one via.

11. The wiring layer stack of claim 7, further comprising a barrier film adjacent the first vertical electrode of the at least one capacitor, and vertically between the first wiring layer and the ILD layer.

12. A method to form a capacitor for an integrated circuit (IC), the method comprising: forming a first opening within a first portion of an inter-level dielectric (ILD) layer to expose a first conductor below the first portion of the ILD layer; forming a first vertical electrode on an upper surface of the first conductor and within the first portion of the ILD layer to fill the first opening, the first vertical electrode having a sidewall; forming a capacitor dielectric on an upper surface of the first vertical electrode, and including a sidewall vertically aligned with the sidewall of the first vertical electrode; forming a second vertical electrode on an upper surface of the capacitor dielectric, and including a sidewall vertically aligned with the sidewall of the first vertical electrode; and forming a second portion of the ILD layer on an upper surface of the first portion of the ILD layer, adjacent the capacitor dielectric and the second vertical electrode, forming a second conductor on an upper surface of the second vertical electrode and above the second portion of the ILD layer, wherein the first conductor is coupled to the second conductor through a capacitor including the first vertical electrode, the capacitor dielectric, and the second vertical electrode, wherein the second conductor is vertically aligned with the first vertical electrode, the capacitor dielectric and the second vertical electrode.

13. The method of claim 12, further comprising:
forming an overlying conductor on the second vertical electrode, wherein forming the second portion of the ILD causes a top surface of the ILD to be approximately coplanar with a top surface of the overlying conductor.

14. The method of claim 12, wherein forming the capacitor dielectric includes forming a nitride dielectric material on the upper surface of the first vertical electrode to a thickness of between approximately five nanometers (nm) and approximately fifteen nm.

15. The method of claim 12, further comprising:
forming a barrier film on an upper surface of a wiring layer, the wiring layer including the first conductor; and
forming the first portion of the ILD layer on an upper surface of the barrier film,
wherein forming the first opening within the first portion of the ILD layer further includes forming the first opening through the barrier film.

16. The method of claim 12, further comprising forming a via within the first portion of the ILD layer and the second portion of the ILD layer, wherein the ILD layer is horizontally between the via and each of the first vertical electrode, the capacitor dielectric, and the second vertical electrode.

\* \* \* \* \*